US006690360B2

(12) United States Patent
Johnston et al.

(10) Patent No.: US 6,690,360 B2
(45) Date of Patent: Feb. 10, 2004

(54) LIQUID PROOF SWITCH ARRAY

(75) Inventors: Raymond Patrick Johnston, Lake Elmo, MN (US); Jennifer Rebecca Yi, Roseville, MN (US); Brian Edward Spiewak, Inver Grove Heights, MN (US)

(73) Assignee: 3M Innovative Properties Company, St. Paul, MN (US)

( * ) Notice: Subject to any disclaimer, the term of this patent is extended or adjusted under 35 U.S.C. 154(b) by 267 days.

(21) Appl. No.: 09/848,458

(22) Filed: May 3, 2001

(65) Prior Publication Data

US 2002/0163503 A1 Nov. 7, 2002

(51) Int. Cl.[7] .......................... G09G 5/00; H01H 1/10; H03K 17/94

(52) U.S. Cl. .......................... 345/168; 200/513; 341/27

(58) Field of Search .......................... 345/168, 169, 345/173; 200/5 A, 5 E, 5 R, 512, 513, 514, 515, 516, 517, 314; 341/22, 27, 34

(56) References Cited

U.S. PATENT DOCUMENTS

| | | | | |
|---|---|---|---|---|
| 3,266,113 A | | 8/1966 | Flanagan, Jr. | |
| 3,879,835 A | | 4/1975 | Brumlik | |
| 4,109,118 A | | 8/1978 | Kley | 200/5 E |
| 4,249,044 A | | 2/1981 | Larson | 200/5 A |
| 4,290,832 A | | 9/1981 | Kalleberg | |
| 4,421,958 A | | 12/1983 | Kameda | 200/5 A |
| 4,423,294 A | * | 12/1983 | Walser et al. | 200/513 |
| 4,442,055 A | | 4/1984 | Oelsch et al. | |
| 4,500,758 A | | 2/1985 | Guckenheimer | 200/5 A |
| 4,508,942 A | | 4/1985 | Inaba | 200/5 A |
| 4,570,039 A | | 2/1986 | Osawa et al. | |
| 4,862,499 A | | 8/1989 | Jekot et al. | 379/368 |
| 4,894,060 A | | 1/1990 | Nestegard | |
| 5,119,531 A | | 6/1992 | Berger et al. | |
| 5,218,177 A | * | 6/1993 | Coleman et al. | 200/515 |
| 5,220,521 A | | 6/1993 | Kikinis | |
| 5,235,731 A | | 8/1993 | Anzai et al. | |
| 5,311,656 A | | 5/1994 | Eldershaw | |
| 5,396,687 A | | 3/1995 | Osterman | |
| 5,398,387 A | | 3/1995 | Torigoe et al. | |

(List continued on next page.)

FOREIGN PATENT DOCUMENTS

| | | | |
|---|---|---|---|
| DE | 32 18 404 A1 | 11/1983 | H01H/13/70 |
| DE | 198 19 693 A1 | 11/1999 | H01H/3/30 |
| DE | 200 02 680 U1 | 6/2000 | H01H/13/14 |
| DE | 200 09 377 U1 | 9/2000 | H01H/13/702 |
| DE | 200 09 919 U1 | 9/2000 | H01H/13/70 |
| DE | 200 16 887 U1 | 2/2001 | H01H/13/705 |
| EP | 0 942 444 A2 | 9/1999 | H01H/13/70 |
| EP | 1 001 443 A1 | 5/2000 | H01H/13/70 |
| EP | 1 024 510 A2 | 8/2000 | H01H/13/70 |
| EP | 1 056 107 A2 | 11/2000 | H01H/13/70 |
| WO | WO 98/39785 | 9/1998 | H01H/13/70 |
| WO | WO 01/58302 | 8/2001 | |
| WO | WO 01/58780 | 8/2001 | |

OTHER PUBLICATIONS

IBM Technical Disclosure Bulletin, "Key Matrix Using a Flulid Medium," p. 744, Aug. 1970.

*Primary Examiner*—Steven Saras
*Assistant Examiner*—Paul A. Bell
(74) *Attorney, Agent, or Firm*—Stephen W. Buckingham

(57) ABSTRACT

Switch arrays such as keyboards are described. The switch arrays may include an array of dome spring elements. Each dome spring element may define a chamber, and a plurality of channels may interconnect the chambers of the dome spring elements such that each chamber of each dome spring element is in fluid communication with the chamber of at least one of the other dome spring elements. The array of dome spring elements may provide a hermetic seal to the bottom side of individual dome spring elements to avoid the sticky key phenomenon. The switch arrays may also include alignments elements. For example, the alignment elements may include hook-like elements that engage one another to define a distance of travel for switches in the switch arrays.

36 Claims, 10 Drawing Sheets

U.S. PATENT DOCUMENTS

| | | | | | |
|---|---|---|---|---|---|
| 5,457,297 | A | | 10/1995 | Chen | 200/344 |
| 5,505,747 | A | | 4/1996 | Chesley et al. | |
| 5,514,843 | A | | 5/1996 | Wilfong et al. | 200/5 R |
| 5,595,449 | A | * | 1/1997 | Vitkin | 341/22 |
| 5,630,501 | A | | 5/1997 | Tsay | 200/344 |
| 5,666,112 | A | | 9/1997 | Crowley et al. | 341/22 |
| 5,742,242 | A | | 4/1998 | Sellers | 341/22 |
| 5,747,756 | A | | 5/1998 | Boedecker | |
| 5,760,351 | A | | 6/1998 | Tsai | 200/5 A |
| 5,812,116 | A | | 9/1998 | Malhi | 345/168 |
| 5,874,700 | A | | 2/1999 | Hochgesang | 200/515 |
| 5,879,088 | A | | 3/1999 | English | 400/481 |
| 5,967,298 | A | | 10/1999 | Watanabe et al. | 200/344 |
| 6,064,019 | A | | 5/2000 | Buchan et al. | 200/302.2 |
| 6,100,478 | A | | 8/2000 | LaPointe et al. | 200/314 |
| 6,130,593 | A | | 10/2000 | Van Zeeland | 335/205 |
| 6,137,072 | A | | 10/2000 | Martter et al. | 200/512 |
| 6,144,003 | A | | 11/2000 | Kamishima | 200/515 |
| 6,166,342 | A | | 12/2000 | Chou | |
| 6,178,619 | B1 | | 1/2001 | Tai | 29/622 |
| 2002/0163451 | A1 | | 11/2002 | Johnston et al. | |

* cited by examiner

LIQUID PROOF SWITCH ARRAY

FIELD

The invention relates to switch arrays for use in computer input devices and, more particularly, to keyboards and keypads.

BACKGROUND

Electronic switches are used to provide input to computer devices. Electronic switches generate signals in response to physical force. For example, a user may actuate an electronic switch by pressing a key. Pressing the key causes a force to be applied on an electronic membrane, which in turn causes the electronic membrane to generate an electronic signal. A computer keyboard is one common example of a switch array.

Many switch arrays, such as keyboards, include dome spring elements to provide a biasing force against individual keys. Dome spring elements provide tactile feedback to a user by providing a defined amount of resistance to key actuation. Moreover, dome spring elements may provide a "snapping" feel upon actuation, wherein the amount of resistance to key actuation drastically decreases after pressing the key past a threshold distance.

Dome spring elements can become contaminated, however, particularly if liquid collects under or within the dome spring elements. When this happens, the resistance of the spring can change, and the "snapping" feel can be lost. Moreover, individual spring elements can become stuck in an actuated position. These phenomena are often referred to as "sticky key" phenomena.

SUMMARY

In general, the invention is directed to various apparatuses for use in switch arrays such as computer keyboards or keypads. In one embodiment, the invention provides an array of dome spring elements for use in a switch array. Each of the dome spring elements defines a chamber. A plurality of channels may interconnect the chambers of the dome spring elements such that each chamber of each dome spring element is in fluid communication with the chamber of at least one of the other dome spring elements. This is advantageous because it allows for key-to-key venting. In addition, the regions between the various dome spring elements may have no holes, thus providing a hermetic barrier to the back side of the individual dome spring elements. This is advantageous because the array of dome spring elements can seal off the individual dome spring elements from the outside environment to avoid the sticky key phenomenon.

In another embodiment, the invention provides a set of alignment elements for use in a switch array. The set of alignment elements may include a bottom layer defining holes for aligning with spring elements, and a top layer engaged with the bottom layer. The top layer is biased away from the bottom layer upon protrusion of spring elements through the holes in the bottom layer. The top and bottom layers may be films that include hook-like elements that engage one another. In this manner, the top and bottom layers can define a predetermined amount of key travel. Moreover, the predetermined amount of key travel may be less than the amount of key travel of conventional keyboards that implement scissors hinges. In addition, the set of alignment elements can provide resistance to key rocking.

One or more aspects of the invention may be used to realize thinner keyboards, and or keyboards that have fewer elements. For example, in one embodiment, the top layer of the set of alignment elements defines keys without the use of additional keycaps. In addition, the invention may provide easier keyboard manufacturing and assembly, and therefore, may lower production costs associated with the manufacturing of keyboards. Also, the invention may result in switch arrays that are flexible, rollable, washable, submersible, or otherwise more useful for various applications.

Additional details of various embodiments are set forth in the accompanying drawings and the description below. Other features, objects and advantages will become apparent from the description and drawings, and from the claims.

DETAILED DESCRIPTION

In general, the invention provides elements for use in switch arrays such as keyboards. For example, in one embodiment, the invention is directed to an array of dome spring elements for use in a switch array. The regions between the respective dome spring elements may have no holes, sealing off the individual dome spring elements from the outside environment. Each of the dome spring elements defines a chamber. A plurality of channels may interconnect the chambers of the dome spring elements such that each chamber of each dome spring element is in fluid communication with the chamber of at least one of the other dome spring elements. For example, upon actuation of one of the dome spring elements, air, or another fluid, may be forced through at least one of the channels. In this manner, fluid can be vented between dome spring elements. In other words, when one dome spring element is actuated by depression of a key, it expels air, or another fluid, into one or more adjacent dome spring elements to redistribute the fluid to idle dome spring elements.

In another embodiment, the invention is directed to an apparatus for use in a switch array having spring elements. The apparatus may be a set of alignment elements. The apparatus may include a bottom layer defining holes for aligning with spring elements, and a top layer engaged with the bottom layer and biased away from the bottom layer upon protrusion of the spring elements through the holes in the bottom layer. The spring elements may be an array of dome spring elements as described above. The apparatus may perform a function similar to conventional scissors hinges used in keyboards. The bottom layer may be a bottom hook film formed with holes for aligning with spring elements. The spring elements may protrude upward through an array of holes defined by the bottom hook film. Top layer may include a plurality of top hook films mechanically engaged with the bottom layer. Each top hook film is biased upward and away from the bottom hook film by one of the spring elements. Alternatively, the top layer may include substantially rigid elements and elastic regions between the rigid elements. Each rigid element can be biased by one of the spring elements of a switch array.

Figure 1:
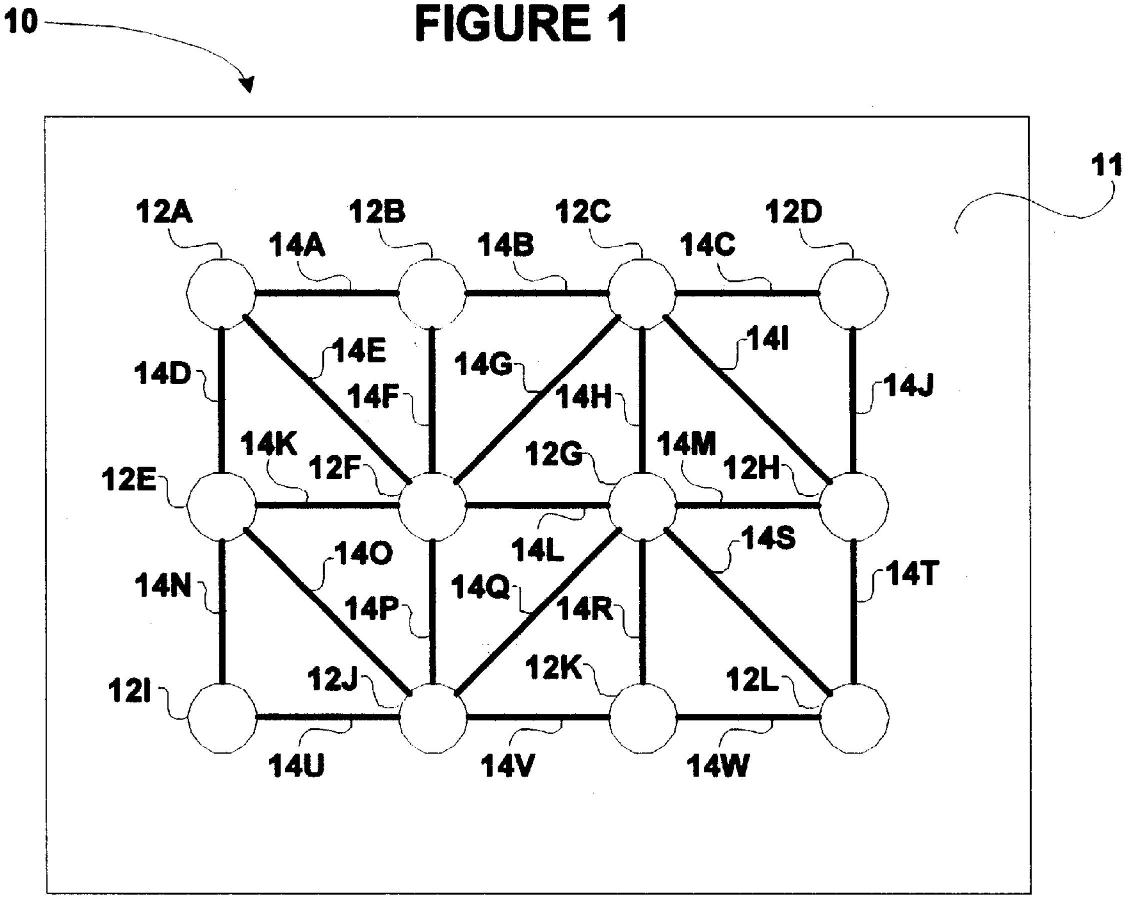
FIG. 1 is a top view of an array of dome spring elements for use in a switch array.

FIG. 1 is a top view of an array of dome spring elements 10 for use in a switch array. The array of dome spring elements 10 includes dome spring elements 12A–12L, hereafter referred to as dome spring elements 12 that are formed on a sheet-like member 11. Channels 14A–14W, hereafter referred to as channels 14, interconnect the chambers of the dome spring elements 12. For example, upon actuation of dome spring element 12A, air, or another fluid, may be forced through channels 14A, 14D and 14E, and into other dome spring elements. Channels 14 may be grooves on the bottom major surface of the sheet-like member 11, or alternatively, channels 14 may be contained within the bottom major surface and the top major surface of the sheet-like member 11.

The array of dome spring elements 10 may have no holes in the regions between the respective dome spring elements 12. In other words, the sheet-like member 11 may be a continuous sheet in the regions between the respective dome spring elements. This may ensure that liquid, e.g., spilled on the array of dome spring elements 10, cannot collect under or within the dome spring elements 12. In this manner, the sheet-like member 11 provides a barrier to the backside of the individual dome spring elements 12 to ensure that the sticky key phenomenon is avoided.

Figure 2:
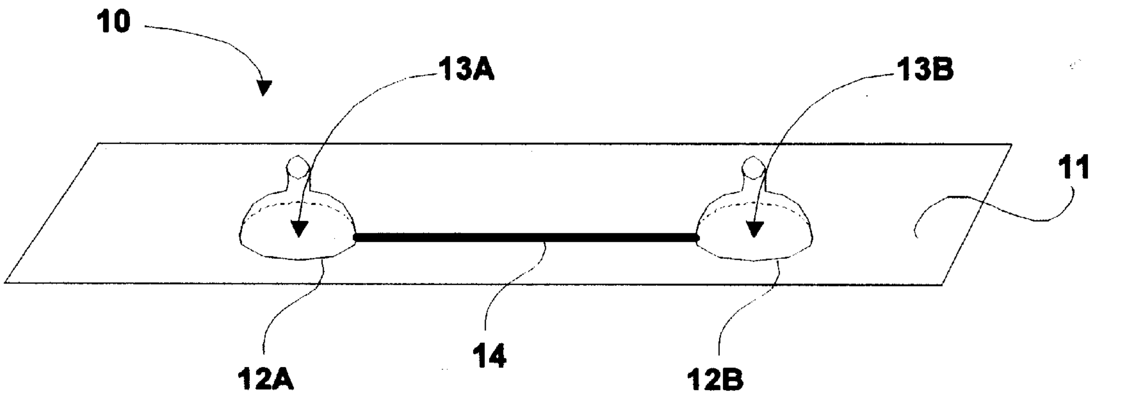
FIG. 2 is a perspective side view of an array of dome spring elements.

FIG. 2 is a side view of an array of dome spring elements 10 including dome spring element 12A and dome spring element 12B. Dome spring elements are generally characterized as having a semi-spherical dome. Often a protrusion, which may be cylindrical, is located at the top of the semi-spherical dome. The semi-spherical dome may define a chamber 13A, 13B within the respective dome spring element 12A, 12B. The dome spring element may also have a cylindrical region at the base of the dome. Channel 14 may connect the chamber 13A of dome spring element 12A to the chamber 13B of dome spring element 12B.

Again, channel 14 may be a groove on the bottom major surface of the sheet-like member 11, or alternatively, channel 14 may be contained within the bottom major surface and the top major surface of the sheet-like member 11. For example, if channel 14 is a groove on the bottom major surface of the sheet-like member 11, the groove may form the top part of a passageway when the array of dome spring elements 10 is placed on substantially flat surface. In that case, the substantially flat surface may form the bottom part of the passageway. An array of dome spring elements can be fabricated as described below.

An array of dome spring elements 10 can be formed, e.g., by compression molding using a dual-sided tool. Synprene thermoplastic elastomer (supplied by PolyOne of Cleveland, Ohio), with a durometer of 40, can be heated to 150 degrees Celsius and injected into a mold at a pressure of approximately 1,100,000 Pascals (approximately 160 pounds per square inch), for two minutes. The pressure can then be increased to approximately 2,300,000 Pascals (approximately 350 pounds per square inch) for an additional five minutes. The result is a sheet-like array of molded dome spring elements 10. The array can be sized for use in a keyboard, or sized much larger and cut into smaller sheets for use in keyboards, keypads, membrane switches, or other input devices.

Figure 3:
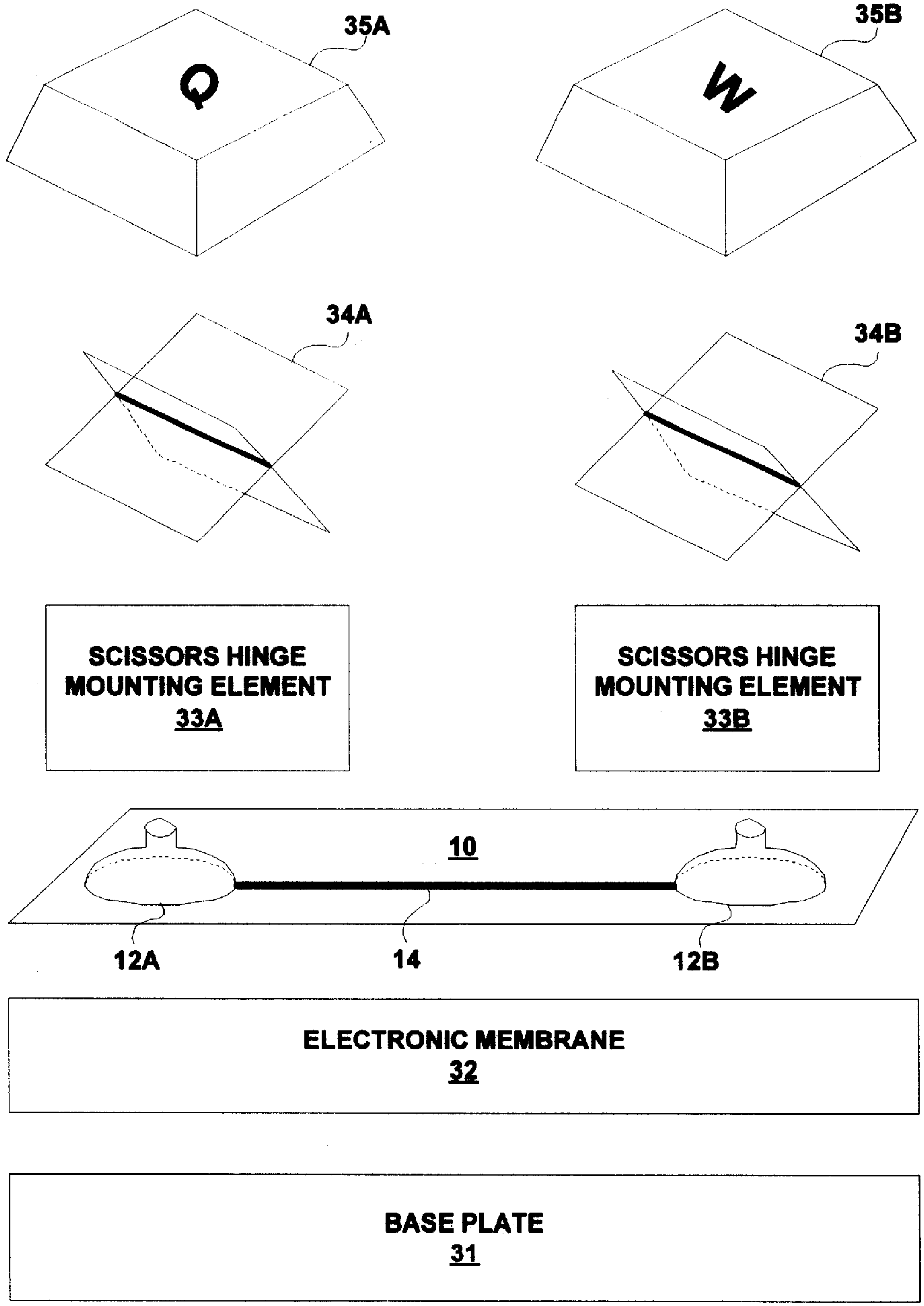
FIGS. 3 and 4 are exploded block diagrams respectively illustrating two switches of a switch array according to embodiments of the invention.

FIG. 3 is an exploded block diagram of two switches of a switch array, e.g., two keys of a keyboard. As shown, the switch array may include a base plate 31 formed from metal, plastic, or another rigid material to provide mechanical stability. An electronic membrane 32 may reside on top of the base plate 31. The electronic membrane 32 may include a plurality of sensors that generate signals in response to applied physical force. An array of dome spring elements 10 may reside on top of electronic membrane 32. For example, the respective chambers of dome spring elements 12A and 12B may be connected by a channel 14. The array of dome spring elements 10 can be placed on the electronic membrane 32 so that channel 14, in the form of a groove on the bottom major surface of the array of dome spring elements, forms a passageway with the top major surface of the electronic membrane 32. Scissors hinge mounting elements 33A and 33B may reside on top of the array of dome spring elements 10, and scissors hinges 34A and 34B can be mounted into the scissors hinge mounting elements 33. Scissors hinge mounting elements 33 may take the form of discrete mounting brackets, e.g., machined out of metal. Key caps 35A and 35B may be placed on top of the scissors hinges 34.

For example, a user may actuate an electronic switch by pressing the key cap 35A. Scissors hinge 34A directs the user actuated force in a direction perpendicular to the major surface of the array of dome spring elements 10 causing dome spring element 12A to be depressed. Air, or another fluid, may flow through channel 14 as the dome spring element 12A is depressed. In this manner, air can be vented between the respective chambers of dome spring elements 12A and 12B. Moreover, depressing dome spring element 12A may cause a force to be applied on an electronic membrane 32, which in turn causes the electronic membrane 32 to generate an electronic signal. For example, a depressed dome spring element may short the electronic membrane 32, causing the electronic membrane to generate the electronic signal. The electronic signal may cause a computer to display the letter Q, corresponding to key cap 35A. The electronic membrane may include a single electronic layer which is shorted by the dome elements, a sandwich layer or membrane of sensor elements, capacitance sensor elements, Hall effect sensor elements, piezo sensor elements, or the like. Alternatively, mechanical signals, optical signals, or the like could be generated. In addition, in other configurations, multiple dome spring elements could be associated with a single key.

Conventional keyboards generally make use of scissors hinges to direct user actuated force onto an electronic membrane in the direction perpendicular to the major surface of the electronic membrane. Conventional keyboards form scissors hinge mounting elements on the base plate. For example, the base plate is usually machined to include mounting brackets for scissors hinges. The brackets on the base plate protrude through holes on the electronic membrane. Moreover, the brackets on the base plate may protrude through the array of dome spring elements. Therefore, conventional keyboards require dome spring elements to be either separate discrete elements, or to form an array of dome spring elements with holes in the regions between the dome spring elements.

However, discrete separate dome spring elements and arrays of dome spring elements with holes between the dome spring elements do not provide a hermetic barrier to the bottom sides of the dome spring elements. For this reason, in conventional keyboards, liquid may be able to collect under or within the dome spring elements, resulting in the sticky key phenomenon.

FIG. 3 illustrates one configuration of a switch array that overcomes the sticky key phenomenon by providing a hermetic barrier to the bottom side of the dome spring elements. However, the configuration of FIG. 3 may require many separate hinge mounting elements to be machined, and then individually placed during the assembly of the switch array.

Figure 4:
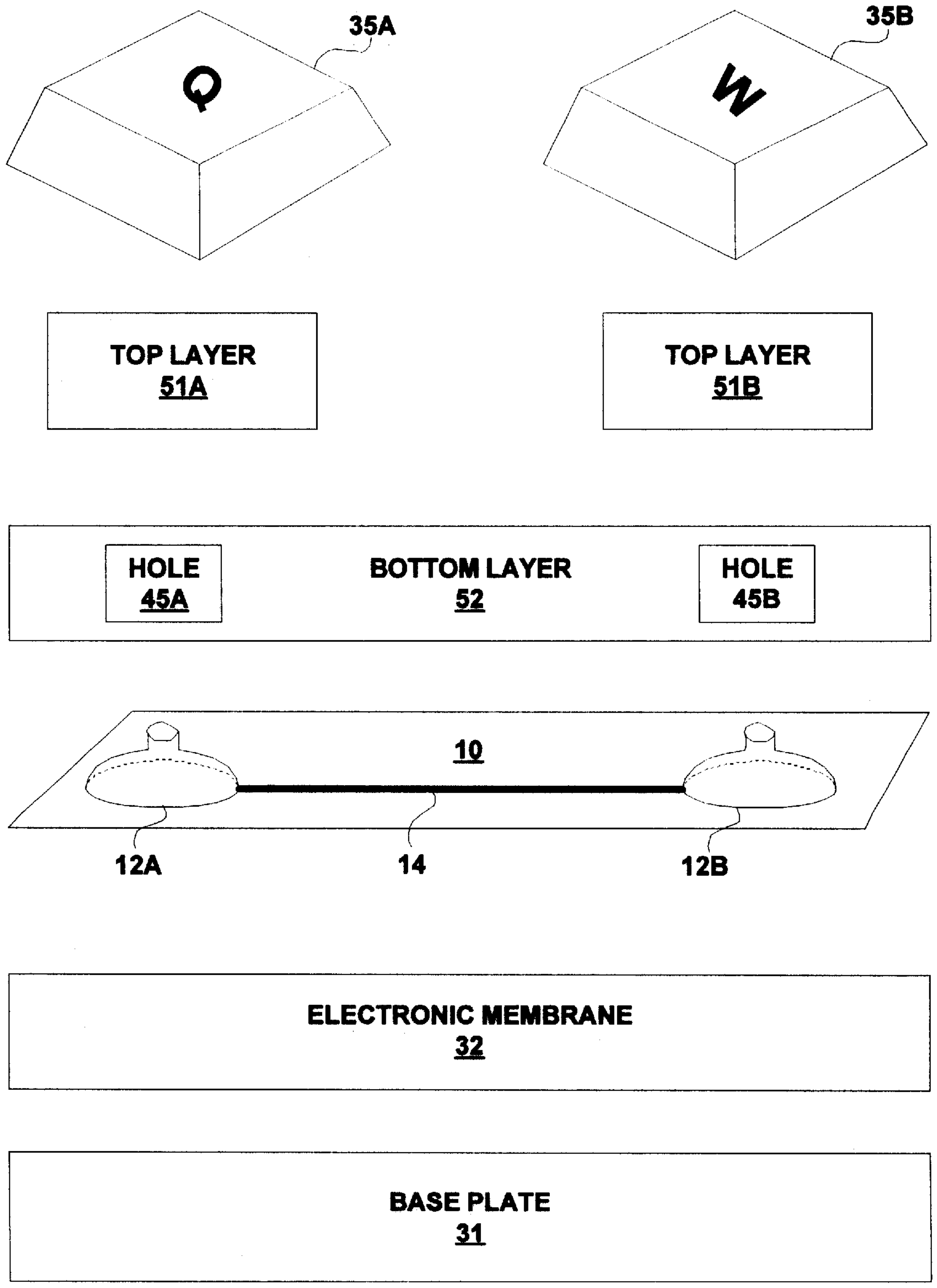

FIG. 4 illustrates an alternative configuration that does not make use of scissors hinges and therefore avoids the above mentioned limitations introduced by scissors hinge mounting elements. FIG. 4 is an exploded block diagram of two switches of a switch array, e.g., two keys of a keyboard. In place of scissors hinges, the switch array illustrated in FIG. 4 makes use of a set of alignment elements that include top and bottom layers. The top and bottom layers may include hook-like elements that engage one another. For example, in one implementation, the top and bottom layers are hook films molded to form hook-like elements that extend outward from a major plane of the films. As shown in FIG. 4, a plurality of top layer sections 51A, 51B and a single bottom layer 52 define the set of alignment elements.

As shown in FIG. 4, the switch array may include a base plate 31 to provide mechanical stability. Base plate 31 may be formed of metal, plastic, or another suitable rigid material. An electronic membrane 32 may reside on top of the base plate 31. The electronic membrane 32 includes a plurality of sensors that generate signals in response to an applied physical force. An array of dome spring elements 10 may reside on top of electronic membrane 32. For example, the respective chambers of dome spring elements 12A and 12B may be connected by a channel, although the embodiment of FIG. 4 is not necessarily limited in that respect. A set of alignment elements may include a bottom layer 52 and top layer sections 51A and 51B. Bottom layer 52 may have holes 45A and 45B, through which the dome spring elements 12A and 12B respectively protrude. Top layer sections 51A and 51B may be mechanically engaged with the bottom layer 52. Additionally, key caps 35A and 35B may be attached to the respective top layer sections 51A and 51B. Alternatively, top layer sections 51A and 51B may function as the keys without the additional key caps 35A and 35B.

Figure 5A:
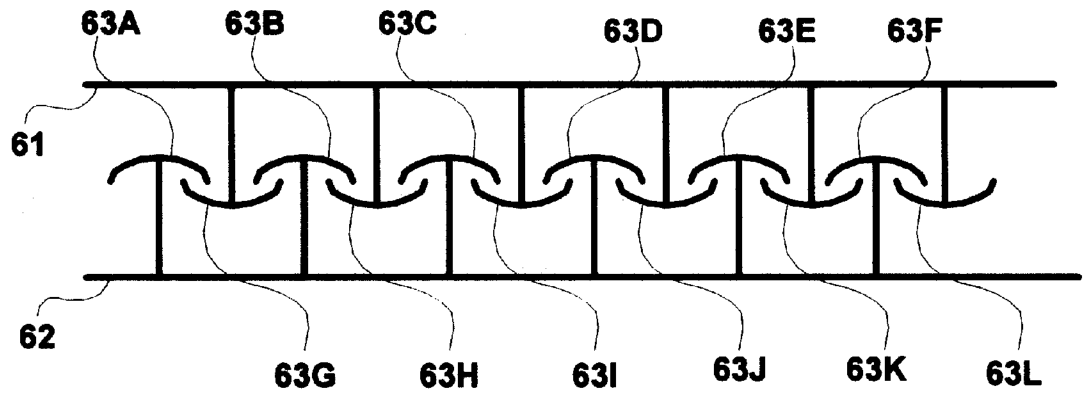
FIGS. 5A and 5B are cross-sectional views of a set of alignment elements in the form of a top hook film mechanically engaged with a bottom hook film.
Figure 5B:
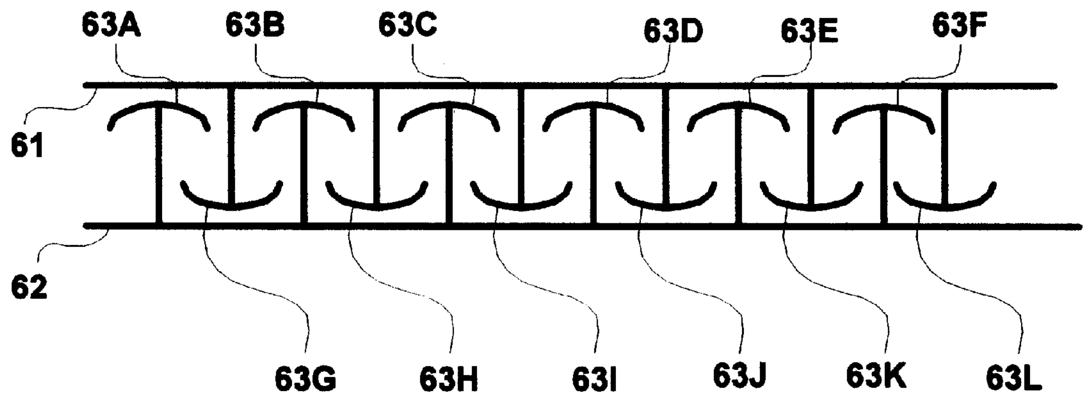
Figure 6:
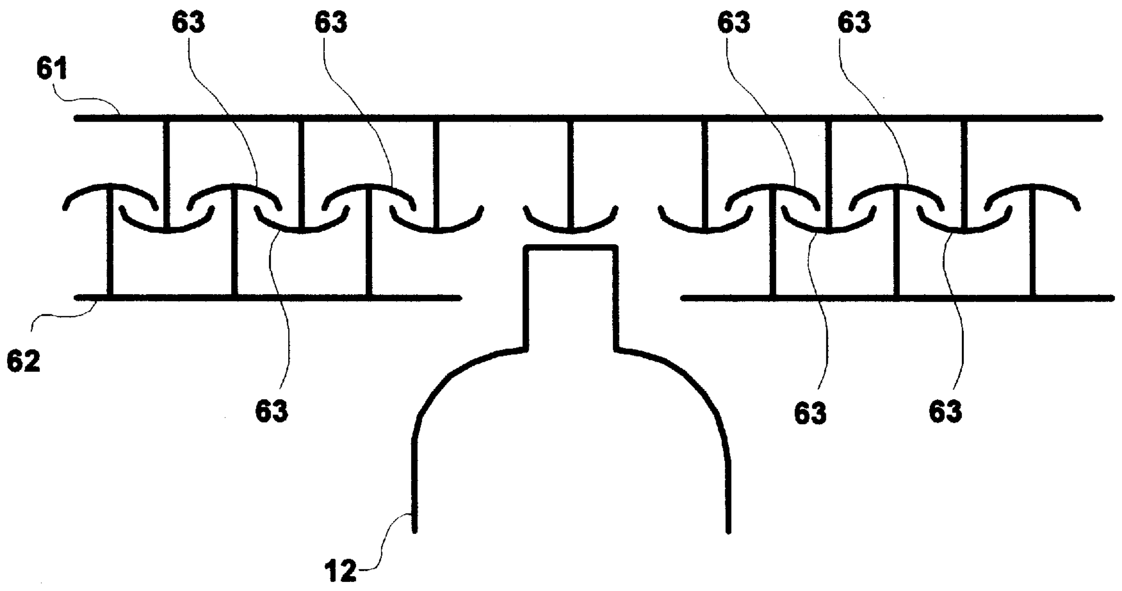
FIG. 6 is a cross sectional view of mechanically engaged top and bottom hook films with a dome spring element biasing the top hook film.

FIGS. 5A and 5B are cross sectional views of a top layer in the form of a top hook film 61 mechanically engaged with a bottom layer in the form of a bottom hook film 62. FIG. 6 is a cross sectional view of mechanically engaged top and bottom hook films 61, 62 with a dome spring element 12 biasing the top hook film 61. In FIG. 5A, top hook film 61 engages bottom hook film 62 in an open position, and in FIG. 5B, top hook film 61 engages bottom hook film 62 in a closed position. The distance between the open and closed positions may define a predetermined distance of travel for a given switch in a switch array, e.g., a key in a keyboard. The top and bottom hook films 61 and 62 include a plurality of hook-like elements 63A–63I that engage one another. By way of example, distance between respective hook-like elements, e.g., the distance between element 63A and 63B at the point of attachment to the base film may be approximately 0.25 centimeters, although the invention is not limited in that respect. In that case, approximately 9 or 10 hook-like elements 63 may reside on a 2.5 centimeter wide hook film. Each hook-like element 63 may have a length corresponding to the length of the hook film.

The hook films illustrated in FIGS. 5A and 5B may further include spring-like elements (not shown) such as elastic balls or posts to provide a biasing force that tends to bias the top hook film 61 and bottom hook film 62 in an open position (as illustrated in FIG. 5A). The hook films may be engaged by snapping or sliding them together. The predetermined distance of travel allowed between the top and bottom hook films 61, 62 may be proportional to the size of hook-like elements 63. For example, the height at which the hook-like elements 63 protrude from the respective hook films 61, 62 may be slightly larger than the amount of travel allowed between the top and bottom hook films 61, 62. For example, the hook element height (the distance from the hook film to the top of the hook-like element, measured in a plane perpendicular to the base of the hook film) may be in the range of 0.01 centimeters to 1 centimeter. The hook-like elements may have a hook element width (the distance between the outermost ends of a hook-like element 63, measured in a plane parallel to the base of the hook film) in the range of 0.05 centimeters to 1 centimeter. The distance of travel may be in the range of 0.01 centimeters to 1 centimeter. For example, a distance of travel of less than 3 millimeters; less than 2 millimeters; or even less than 1 millimeter may be desirable for various applications, such as thin keyboards or thin keypads.

FIG. 6 is a cross sectional view of mechanically engaged top and bottom hook films 61 and 62 with a dome spring element 12 biasing against the top hook film 61. As shown in FIG. 6, hook-like elements 63 formed on films 61, 62 overlap with one another to provide an interlocking arrangement when the hook films 61, 62 are engaged. Dome spring element 12 biases the top hook film 61 to place the top and bottom hook films 61 and 62 into the open position. A user-actuated downward force against the top hook film 61 depresses the dome spring element 12 and causes the top and bottom hook films to be in the closed position. The respective top and bottom hook films 61 and 62 can be fabricated to define a predetermined distance between the open and closed position. In this manner, the distance of travel of switches in a switch array, e.g., keys in a keyboard, can be predefined. For example, approximately 1 to 3 millimeters of travel may be desirable.

Top and bottom hook films 61 and 62 may direct user actuated force to ensure that dome spring element 12 becomes depressed in response to the user actuated force. In addition, top and bottom hook films 61, 62 may provide resistance to rocking of individual switches, and may ensure that individual switches are held in place and properly aligned with individual dome spring elements. In this manner, top and bottom hook films 61 and 62 can replace conventional scissors hinges in a switch array.

Top and bottom hook films 61 and 62 provide several advantages over conventional scissors hinges. For example, hook films can be fabricated at relatively low cost by extrusion or injection molding. Moreover, assembly of switch arrays can be simplified significantly by replacing discrete scissors hinges with top and bottom hook films 61, 62. The hook films 61, 62 can be engaged simply by sliding or snapping then together such that hook-like elements 63 overlap one another to provide an interlocking arrangement. Moreover, the machining of scissors hinge mounting brackets, e.g., on the base plate, is avoided. In addition, top and bottom hook films 61 and 62 may realize thinner switch arrays by reducing the amount of key travel and reducing the number of layers in the switch array.

Figure 7:
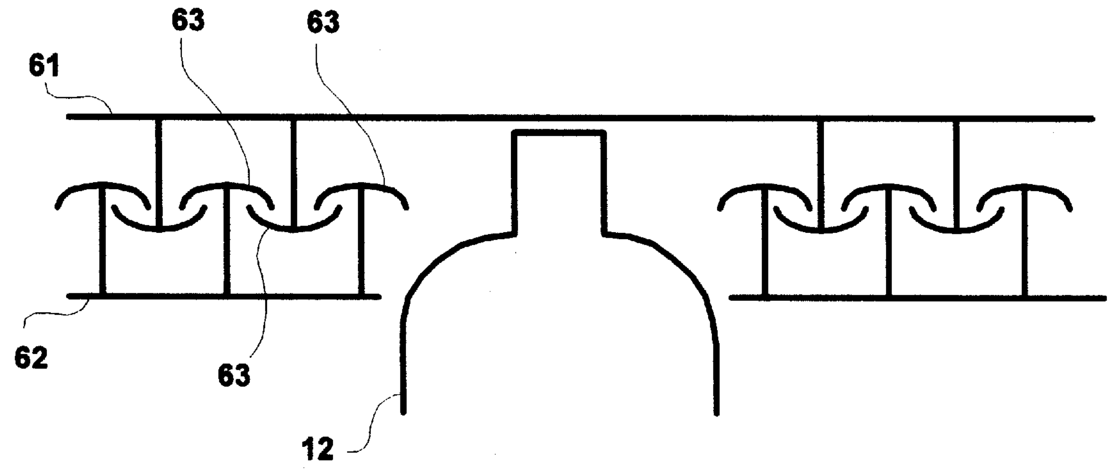
FIG. 7 is another cross sectional view of mechanically engaged top and bottom hook films with a dome spring element biasing the top hook film.

FIG. 7 is another cross sectional view of mechanically engaged top and bottom hook films 61 and 62 with a dome spring element 12 biasing against the top hook film 61. However, in FIG. 7, the hook-like elements 63 are removed from the top hook film 61 at the location where dome spring element 12 biases against the top hook film 61. In other embodiments, dome spring element 12 may be attached to top hook film 61 by an adhesive or the like.

Figure 8:
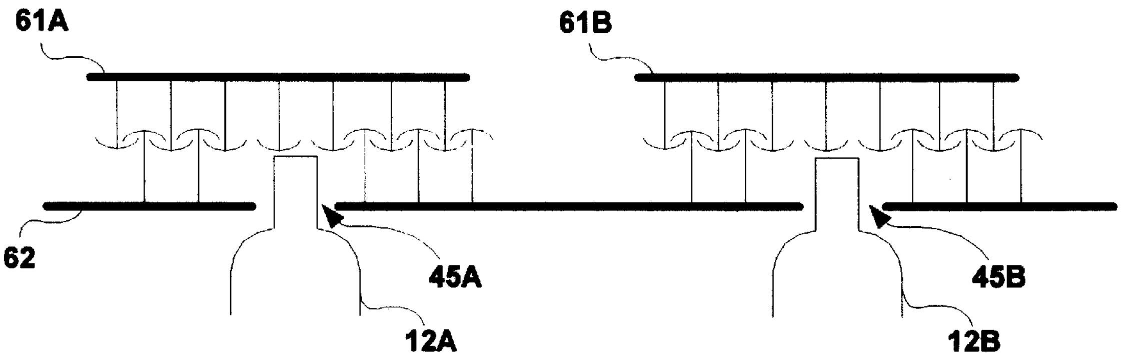
FIG. 8 is a side view of an engaged set of alignment elements in the form of a bottom hook film and a plurality of top hook films.
Figure 9:
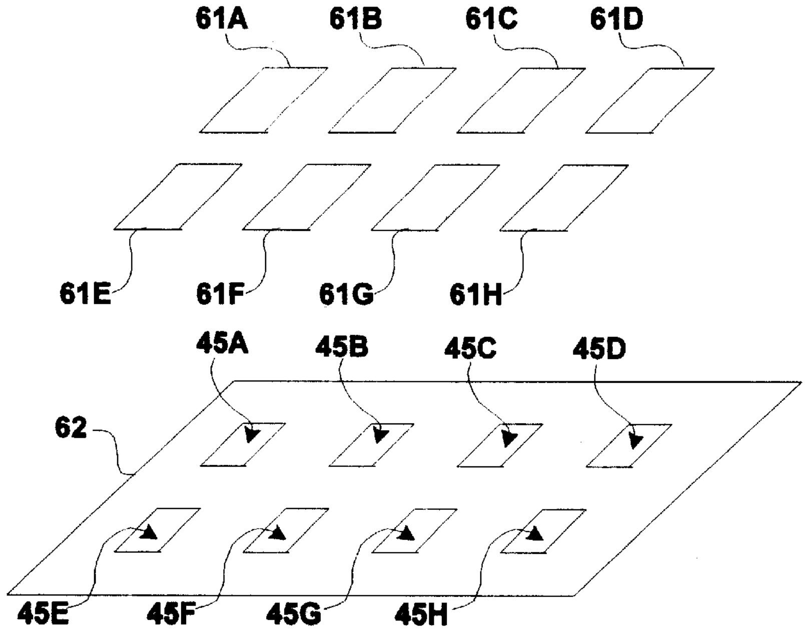
FIG. 9 is a perspective view of an unengaged set of alignment elements in the form of a bottom hook film and a plurality of top hook films.

FIGS. 8 and 9 illustrate one embodiment, implementing a set of alignment elements in the form of a bottom layer including a bottom hook film 62 and a top layer including a plurality top layer sections in the form of top hook films 61A, 61B. FIG. 8 is a cross sectional view. As shown, a bottom hook film 62 is engaged with a plurality top hook films 61A and 61B. Thus, the embodiment of FIG. 8 substantially conforms to that of FIG. 6, but incorporates a top layer that is divided into a number of top layer sections in the form of discrete hook films 61A, 61B. Bottom hook film 62 is formed with holes 45A and 45B for aligning with spring elements 12A and 12B. For example, holes 45 may be sized in the range of 0.1 to 2 square centimeters. In one particular implementation, holes 45 are square shaped with a surface area of approximately 0.635 square centimeters.

In a switch array, top hook films 61A, 61B may function as the keys that are depressed by a user. In this manner, thinner switch arrays, and/or switch arrays having fewer elements can be realized. Alternatively, additional keycaps (not shown) may be attached to the respective top hook films 61A, 61B to be depressed by a user. In addition, in other embodiments, multiple dome spring elements protrude through the same hole. In that case, the multiple dome spring elements that protrude through the same hold may be associated with the same switch of a switch array.

FIG. 9 is a perspective view of an unengaged set of alignment elements in the form of a bottom hook film 62 and a plurality of top hook films 61A–61H. As shown, the bottom hook film 62 is formed with holes 45A–45H for aligning with spring elements (not shown). Each top hook film 61A–61H may cover one of the holes 45A–45H when the hook films are engaged. For example, the top and bottom hook films 62 and 61A–61H can be engaged simply by sliding or snapping the top hook films 61A–61H onto the bottom hook film 62. Again, in a switch array, top hook films 61A–61H may function as the keys that are depressed by a user, or alternatively, additional keycaps (not shown) may be attached to the respective top hook films 61A–61H.

In the embodiment illustrated in FIGS. 8 and 9, it may be desirable to prevent lateral movement of top hook films 61A–61H relative to bottom hook film 62 when the films are engaged. One way to achieve this is to attach the top hook films 61A–61H to dome spring elements via an adhesive or other suitable attachment means. For example, referring to FIG. 8, top hook film 61A could be attached to dome spring element 12A and top hook film 61B could be attached to dome spring element 12B.

Another way to prevent lateral movement of top hook films 61A–61H relative to bottom hook film 62 is to form regions (not shown) in bottom hook film 62. A region may define an area for placement of a top hook film 61 to limit the lateral motion of top hook film 61 relative to bottom hook film 62 when the films are engaged. For example, the hook-like elements of bottom hook film 62 could be heat sealed or crushed by a die in selected places to form the regions. Regions could be created in bottom hook film 62 to define the area for placement of each top hook film 61.

Figure 10:
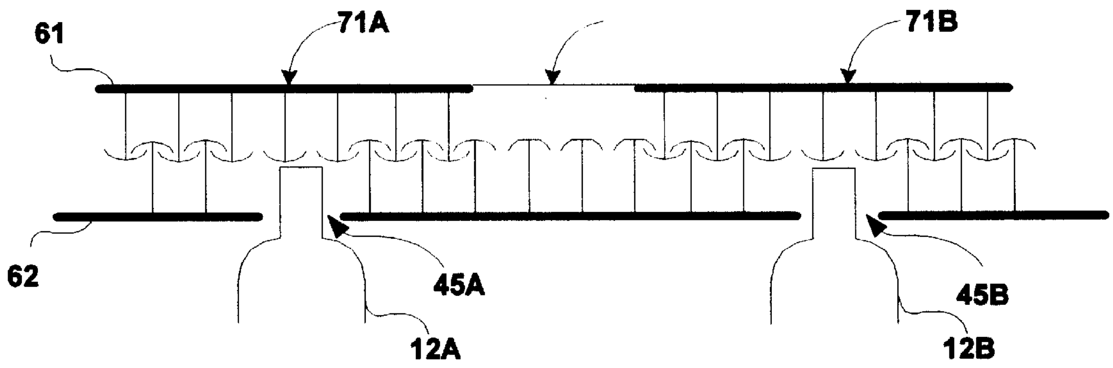
FIG. 10 is a side view of an engaged set of alignment elements in the form of a bottom hook film and a single top hook film having rigid elements and elastic regions.
Figure 11:
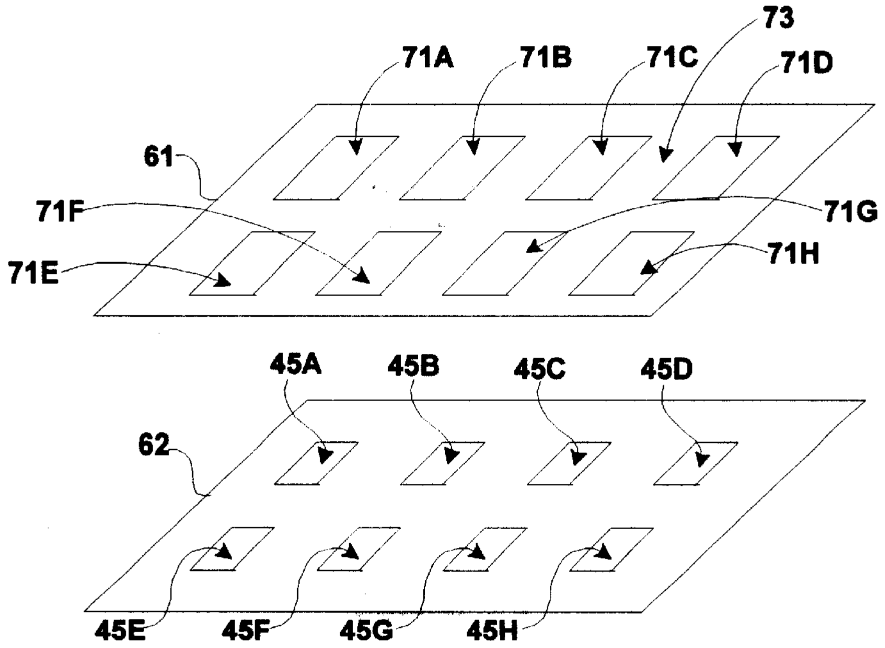
FIG. 11 is a perspective view of an unengaged set of alignment elements in the form of bottom hook film and a single top hook film having rigid elements and elastic regions.

FIGS. 10 and 11 illustrate another embodiment, implementing a set of alignment elements in the form of a bottom layer including a bottom hook film 62 and a top layer including a single top hook film 61 having rigid elements 71 and elastic regions 73. FIG. 10 is a cross sectional view. As shown, a bottom hook film 62 is engaged with a top hook 61. Bottom hook film 62 is formed with holes 45A and 45B for aligning with spring elements 12A and 12B. Top hook film 61 includes rigid elements 71A and 71B and an elastic region 73. For example, in a switch array, rigid elements 71A and 71B may function as the keys that are depressed by a user. Alternatively, additional keycaps (not shown) may be attached to the respective rigid elements 71A and 71B.

FIG. 11 is a perspective view of an unengaged set of alignment elements in the form of a bottom hook film 62 and a top hook films 61 according to an embodiment of the invention. As shown, the bottom hook film 62 is formed with holes 45A–45H for aligning with spring elements (not shown). Top hook film 61 includes rigid elements 71A–71H and one or more elastic regions 73 between the respective rigid elements 71A–71H. Each rigid element 71A–71H may cover one of the holes 45A–45H when the hook films are engaged. For example, the hook films can be engaged simply by sliding or snapping the top hook film 61 and the bottom hook film 62 together. Hook films can be fabricated as described below.

A melt processable ethylene-propylene copolymer (7C55H or 7C06 supplied by Union Carbide Corporation, now Dow Chemical Corp. of Midland, Mich.) can be fed into a single screw extruder (supplied by Davis Standard Corporation of Pawcatuck Conn.) having a diameter of approximately 6.35 centimeters (2.5 inches), a length/diameter ratio of 24/1, and a temperature profile that steadily increases from approximately 175–232 degrees Celsius (350–450 degrees Fahrenheit). The polymer can be continuously discharged at a pressure of at least 690,000 Pascals (100 pounds per square inch) through a necktube heated to 232 degrees Celsius (450 degrees Fahrenheit) and into a 20-centimeter wide (8-inch wide) MasterFlex LD-40 film die (supplied by Production Components of Eau Claire, Wis.), maintained at a temperature of 232 degrees Celsius (450 degrees Fahrenheit). The die may have a die lip configured to form a polymeric hook film having hook-like elements forming a self-mating profile as shown in FIGS. 5A and 5B.

The film can be extruded from the die and drop-cast at about 3 meters/minute (10 feet/minute) into a quench tank maintained at 10–21 degrees Celsius (50–70 degrees Fahrenheit) for a residence time of at least 10 seconds. The quench medium may be water with 0.1–1.0% by weight of a surfactant, Ethoxy CO-40 (a polyoxyethylene caster oil available from Ethox Chemicals, LLC of Greenville, S.C.), to increase wet-out of the hydrophobic polyolefin materials.

The quenched film can then be air-dried and collected in 91–137 meter rolls (100–150 yard rolls). The film may have a uniform base film caliper of approximately 0.0356+/−0.005 centimeters (0.014+/−0.002 inches), a hook element width (the distance between the outermost ends of the hook element arms, measured in a plane parallel to the base of the film) of about 0.1524+/−0.005 centimeters (0.060+/−0.002 inches). The film may have an extruded basis weight of approximately 700 grams/square meter. The vertical travel permitted may be approximately 0.094 centimeters (0.037 inches). In a separate operation, the extruded films can be annealed to flatten the base sheet by passage over a smooth cast roll maintained at approximately 93 degrees Celsius (200 degrees Fahrenheit), and then wound onto 15.24 centimeter cores (6 inch cores) to minimize web-curl.

Figure 12:
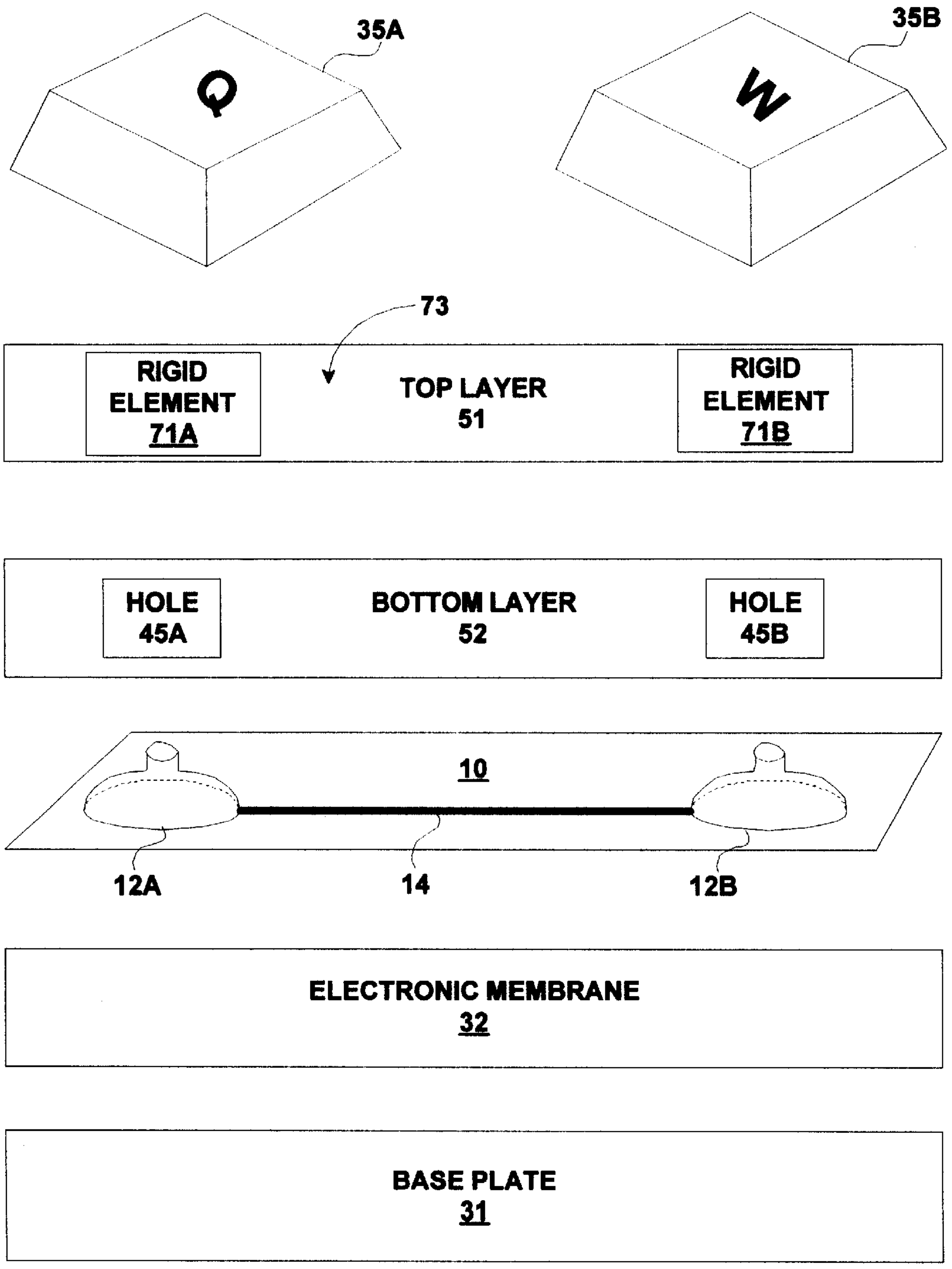
FIG. 12 is an another exploded block diagram of two switches of a switch array according to an embodiment of the invention.

FIG. 12 is an exploded block diagram of two switches of a switch array, e.g., two keys of a keyboard. As shown, a switch array may include a base plate 31 to provide mechanical stability. An electronic membrane 32 may reside on top of the base plate 31. The electronic membrane may include a plurality of sensors that generate signals in response to an applied physical force. An array of dome spring elements 10 may reside on top the electronic membrane 32. For example, the chambers of the dome spring elements 12A and 12B may be connected by channel 14. The array of dome spring elements 10 can be placed on the electronic membrane 32 so that channel 14, in the form of a groove on the bottom major surface of the array of dome spring elements forms a passageway with the top major surface of the electronic membrane 32.

Bottom layer 52 is formed with holes 45A–45B for aligning with dome spring elements 12A and 12B. Top layer 51 includes rigid elements 71A and 71B and elastic regions 73 between the respective rigid elements 71A and 71B. Each rigid element 71A and 71B may cover one of the holes 45A and 45B when the top and bottom layers 51, 52 are engaged. For example, in one embodiment, the top and bottom layers 51, 52 are top and bottom hook films as described above. Key caps 35A and 35B may be placed on top of the rigid elements 71A and 71B, or alternatively, rigid elements 71A and 71B may function as keys without keycaps.

Referring now to FIGS. 5A–12 collectively, the alignment elements illustrated and described above may provide design freedoms to an engineer designing switch arrays. Indeed, compared to conventional switch array configurations, the alignment elements described herein may allow a larger number of keys to be realized in the same amount of area. In addition, as described above, the thickness of switch arrays can be reduced by implementing the alignment elements like those illustrated in FIGS. 5A–12. Moreover, the need for additional keycaps can be eliminated.

Figure 13:
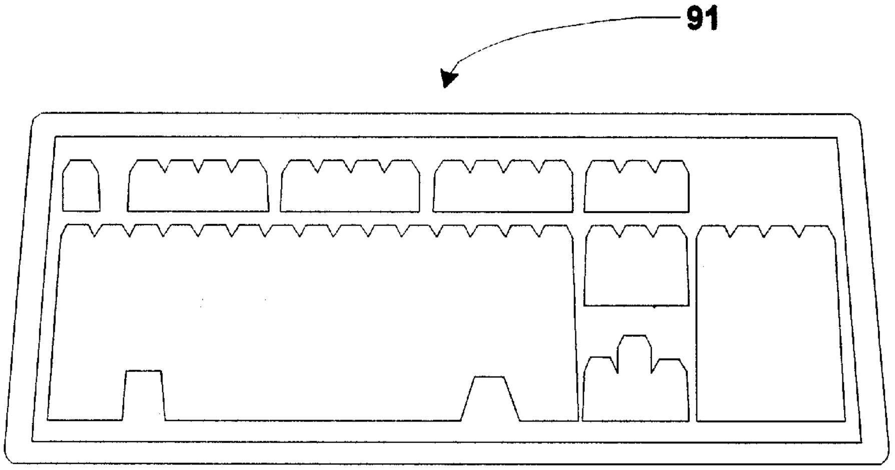
FIG. 13 illustrates a keyboard that may implement the invention.
Figure 14:
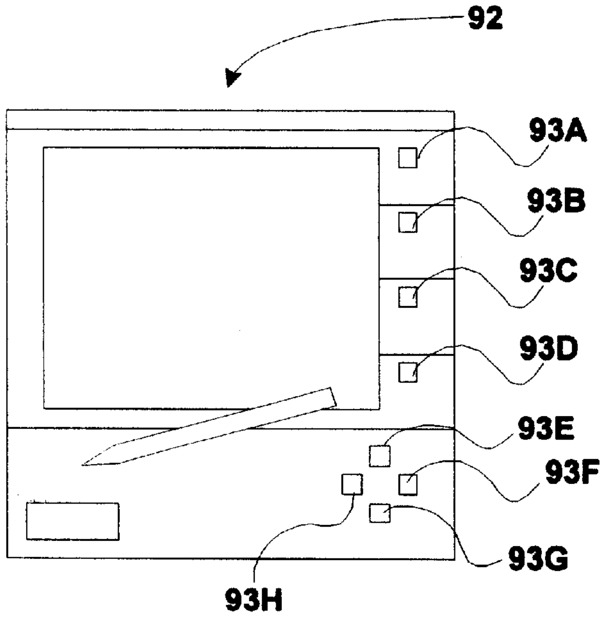
FIG. 14 illustrates a handheld computer that may implement the invention.
Figure 15:
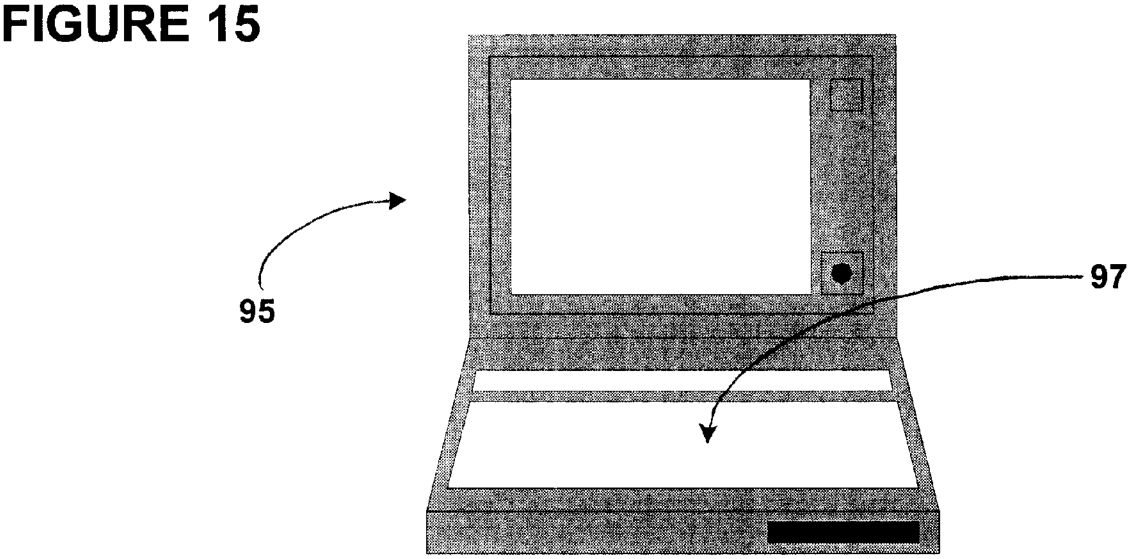
FIG. 15 illustrates a laptop computer that may implement the invention.
Figure 16:
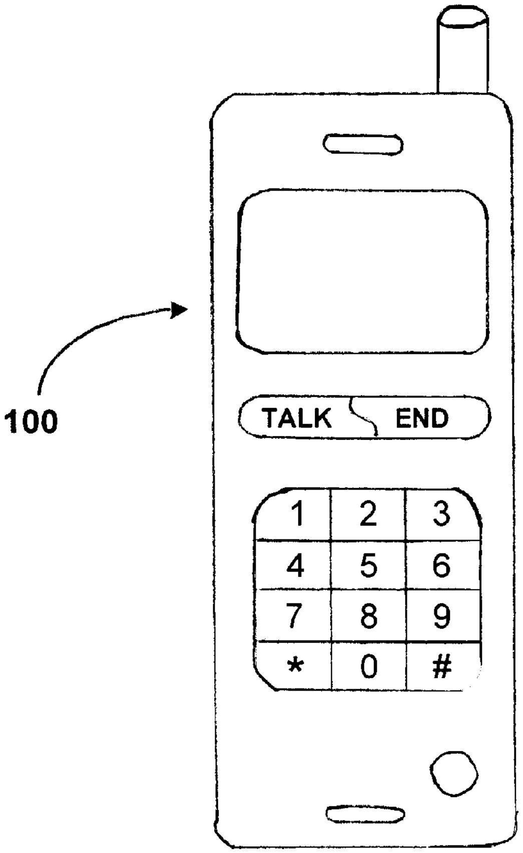
FIG. 16 illustrates a cellular telephone that may implement the invention.

FIGS. 13–16 illustrate four exemplary devices that may implement the invention. FIG. 13 illustrates a keyboard 91 that may include one or more aspects of the invention. FIG. 14 illustrates a handheld computer 92 that may include one or more aspects of the invention as part of keys 93A–93H. FIG. 15 illustrates a laptop computer 95 that may include one or more aspects of the invention as part of laptop keyboard 97. FIG. 16 illustrates a cellular telephone 100 that may include one or more aspects of the invention as part of the keys of the cellular telephone.

For example, the respective devices in FIGS. 13–16 may include an array of dome spring elements that include channels connecting chambers of the respective dome spring elements. In this manner, switch arrays in the respective devices may allow for key-to-key venting. In addition, the array of dome spring elements may be formed with no holes in the regions between dome spring elements to ensure that a hermetic barrier is provided to the bottom side of dome spring elements.

Moreover, the switch arrays in the respective devices in FIGS. 13–16 may include a set of alignment elements including a top layer engaged with a bottom layer to direct user actuated force in the direction perpendicular to the major surface of the array of dome spring elements, and to allow a predetermined amount of travel for the switches in the switch arrays. In addition, the set of alignment elements may securely hold the keys in place, providing alignment and resistance to key rocking. Using various aspects of the invention, the respective devices in FIGS. 13–16 can realize thinner keyboards or keypads, and the keyboards or keypads may have fewer elements than conventional keyboards. In addition, production costs may be reduced by avoiding the use of discrete dome spring elements and/or discrete scissors hinges. The machining of scissors hinge mounting elements can also be avoided.

FIG. 16 illustrates how the design freedoms introduced by the invention may realize improvements in cell phone design. By implementing the alignment elements cell phone 100 does not need molding to hold the keys in place. Moreover, the shape and layout of the keys can be improved both functionally and/or aesthetically. For example, as shown in FIG. 16, adjacent keys may not need to be separated by molding or the like.

The various devices of FIGS. 13–16 may include a processor coupled to a user input device. The user input device may include a switch array that implements one or more aspects of the invention. The processor may take the form of a general purpose microprocessor and can be integrated with or form part of a PC, Macintosh, computer workstation, hand-held data terminal, laptop computer, palm computer, digital paper, cellular telephone, appliance, or the like. The user input device may include a keyboard, keypad and/or any other switch array. The switch array may include an array of dome spring elements according to the invention and/or a set of alignment elements according to the invention.

A number of implementations and embodiments of the invention have been described. For instance, an array of dome spring elements for use in a switch array has been described. In the array of dome spring elements, the chambers of each dome spring element may be connected by at least one channel to the chamber of another dome spring element. In addition, a set of alignment elements for use in a switch array having spring elements has been described. Switch arrays implementing various aspects of the invention may avoid the sticky key phenomenon and may reduce the thickness of the switch array. Moreover, assembly of switch arrays can be simplified, thereby reducing manufacturing and production costs.

Nevertheless, it is understood that various modifications may be made without departing from the spirit and scope of the invention. For example, the invention could be implemented in other switch arrays, such as switch arrays on an instrument panel of an aircraft, watercraft or motor vehicle, or switch arrays in appliances, water-proof devices, submersible devices, or musical instruments. In addition, the top and bottom layers could be engaged by interlocking elements other than hook-like elements. Accordingly, other implementations and embodiments are within the scope of the following claims.

What is claimed:

1. An apparatus comprising:

an array of dome spring elements for use in a switch array, wherein each of the dome spring elements defines a chamber; and a plurality of channels that interconnect the chambers of the dome spring elements such that each chambers of each of the dome spring elements is in fluid communication with at least one of the chambers of another of the dome spring elements, wherein the array of dome spring elements is formed in a sheet-like member, and the channels are contained within a bottom major surface of the sheet-like member and a top major surface of the sheet-like member.

2. The apparatus of claim 1, wherein the switch array is a keyboard.

3. The apparatus of claim 1, wherein regions between the dome spring elements have substantially no holes.

4. The array of dome spring elements of claim 1, wherein upon actuation of one of the dome spring elements, air is forced through at least one of the channels to redistribute air between the chambers of different dome spring elements.

5. A keyboard comprising:

an array of sensor elements that generate signals in response to a force; and an array of dome spring elements corresponding to the sensor elements, wherein each of the dome spring elements defines a chamber, and wherein each of the chambers of each of the dome spring elements is in fluid communication with at least one of the chambers of another of the dome spring elements, wherein the array of dome spring elements is formed in a sheet-like member, and the channels are contained within a bottom major surface of the sheet-like member and a top major surface of the sheet-like member.

6. The keyboard of claim 5, wherein regions between the dome spring elements have substantially no holes.

7. The keyboard of claim 5, further comprising a base plate adjacent the array of sensor elements.

8. The keyboard of claim 5, wherein the array of sensor elements comprises an electronic membrane.

9. A keyboard comprising:

an array of sensor elements that generate signals in response to a force;

an array of dome spring elements corresponding to the sensor elements, wherein each of the dome spring elements defines a chamber, and wherein each of the chambers of each of the dome spring elements is in fluid communication with at least one of the chambers of another of the dome spring elements; and a set of alignment elements adjacent the array of dome spring elements.

10. The keyboard of claim 9, wherein the set of alignment elements are scissors hinges.

11. The keyboard of claim 9, wherein the set of alignment elements includes a top layer engaged with a bottom layer.

12. The keyboard of claim 11, wherein the top and bottom layers are hook films including hook-like elements that provide an interlocking arrangement between the top and bottom layers.

13. The keyboard of claim 12, wherein the hook films comprise a top hook film and bottom hook film, the bottom hook film including holes corresponding to the dome spring elements, wherein the dome spring elements exert a bias force against the top hook film.

14. The keyboard of claim 12, wherein the top layer includes a plurality of top hook films, wherein each dome spring element exerts a bias force against one of the plurality of top hook films.

15. The keyboard of claim 11, wherein the top layer includes substantially rigid elements and elastic regions between the rigid elements, wherein each dome spring element exerts a bias force against one of the rigid elements.

16. The keyboard of claim 15, wherein the rigid elements comprise keys.

17. The keyboard of claim 9, further comprising a set of keycaps adjacent the set of alignment elements.

18. A system comprising:

a processor coupled to an input device, the input device including an array of sensor elements that generate signals in response to a force and an array of dome spring elements corresponding to the sensor elements, each dome spring element defining a chamber, wherein a plurality of channels interconnect the chambers of the dome spring elements such that each of the chambers of each of the dome spring elements is in fluid communication with at least one of the chambers of another of the dome spring elements, and wherein the array of dome spring elements is formed in a sheet-like member, and the channels are contained within a bottom major surface of the sheet-like member and a top major surface of the sheet-like member.

19. The system of claim 18, wherein the system is a desktop computer and the input device is a keyboard.

20. The system of claim 18, wherein the system is a laptop computer and the input device is a keyboard on the laptop computer.

21. The system of claim 18, wherein the system is a handheld computer and the input device is a key pad on the handheld computer.

22. The system of claim 18, wherein the system is a cellular telephone and the input device is a key pad on the cellular telephone.

23. The system of claim 18, wherein the system includes an instrument panel and the input device is a key pad on the instrument panel.

24. The system of claim 18, wherein the system is an appliance and the input device is a key pad on the appliance.

25. The system of claim 18, wherein regions between the dome spring elements have substantially no holes.

26. A system comprising:

a processor coupled to an input device the input device including an array of sensor elements that generate signals in response to a force and an array of dome spring elements corresponding to the sensor elements, each dome spring element defining a chamber, wherein a plurality of channels interconnect the chambers of the dome spring elements such that each of the chambers of each of the dome spring elements is in fluid communication with at least one of the chambers of another of the dome spring elements; and a set of alignment elements adjacent the array of dome spring elements.

27. The system of claim 26, wherein the set of alignment elements includes a top layer engaged with a bottom layer.

28. The system of claim 27, wherein the top and bottom layers are hook films including hook-like elements that provide an interlocking arrangement between the top and bottom layers.

29. The system of claim 28, wherein the hook films comprise a top hook film and bottom hook film, the bottom hook film including holes corresponding to the dome spring elements, wherein the dome spring elements exert a bias force against the top hook film.

30. The system of claim 28, wherein the top layer includes a plurality of top hook films, wherein each dome spring element exerts a bias force against one of the plurality of top hook films.

31. The system of claim 27, wherein the top layer includes substantially rigid elements and elastic regions between the rigid elements, wherein each dome spring element exerts a bias force against one of the rigid elements.

32. The system of claim 31, wherein the rigid elements comprise keys.

33. The system of claim 31, further comprising a set of key caps adjacent the rigid elements.

34. A switch array comprising:

an array of sensor elements that generate signals in response to a force;

an array of dome spring elements correspondence to the sensor elements, wherein each of the dome spring elements defines a chamber;

means for interconnecting the chambers of the dome spring elements such that each of the chambers of each of the dome spring elements is in fluid communication with at least one of the chambers of another of the dome spring elements; and a set of alignment elements adjacent the array of dome spring elements, wherein the set of alignment elements includes a top layer engaged with a bottom layer.

35. The switch array of claim 34, wherein the top and bottom layers are hook films including hook-like elements that provide an interlocking arrangement between the top and bottom layers.

36. The switch array of claim 35, wherein the hook films comprise a top hook film and bottom hook film, the bottom hook film including holes corresponding to the dome spring elements, wherein the dome spring elements exert a bias force against the top hook film.

* * * * *

UNITED STATES PATENT AND TRADEMARK OFFICE

CERTIFICATE OF CORRECTION

PATENT NO. : 6,690,360 B2 
DATED : February 10, 2004
INVENTOR(S) : Johnston, Raymond P.

It is certified that error appears in the above-identified patent and that said Letters Patent is hereby corrected as shown below:

Title page,
Item [56], References Cited, U.S. PATENT DOCUMENTS, delete "4/1984" and insert in place thereof -- 4/1987 --.
OTHER PUBLICATIONS,
"IBM" reference, delete "Flulid" and insert in place thereof -- Fluid --.
Item [57], ABSTRACT,
Line 11, delete "alignments" and insert in place thereof -- alignment --.

Column 2,
Line 49, delete "an" preceding "another".

Column 7,
Line 17, delete "then" and insert in place thereof -- them --.
Line 56, delete "hold" and insert in place thereof -- hole --.

Column 8,
Line 38, delete "films" and insert in place thereof -- film --.

Column 9,
Line 6, delete "caster" and insert in place thereof -- castor --.
Line 32, insert -- of -- following "top".

Column 11,
Line 14, insert -- of the -- following "each"

Column 12,
Line 55, insert -- , -- following "device".

CERTIFICATE OF CORRECTION

PATENT NO. : 6,690,360 B2
DATED : February 10, 2004
INVENTOR(S) : Johnston, Raymond P.

It is certified that error appears in the above-identified patent and that said Letters Patent is hereby corrected as shown below:

Column 14,
Line 4, delete "correspondence" and insert in place thereof -- corresponding --.

Signed and Sealed this

Fifth Day of July, 2005

JON W. DUDAS
*Director of the United States Patent and Trademark Office*